(12) United States Patent
Kwak

(10) Patent No.: US 12,419,045 B2
(45) Date of Patent: Sep. 16, 2025

(54) MANUFACTURING METHOD OF A SEMICONDUCTOR MEMORY DEVICE

(71) Applicant: SK hynix Inc., Icheon-si (KR)

(72) Inventor: Sang Hyon Kwak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 576 days.

(21) Appl. No.: 17/725,981

(22) Filed: Apr. 21, 2022

(65) Prior Publication Data

US 2023/0171956 A1    Jun. 1, 2023

(30) Foreign Application Priority Data

Nov. 26, 2021 (KR) .......................... 10-2021-0165572

(51) Int. Cl.
*H10B 41/27* (2023.01)
*H10B 41/10* (2023.01)
*H10B 43/10* (2023.01)
*H10B 43/27* (2023.01)

(52) U.S. Cl.
CPC ............ *H10B 41/27* (2023.02); *H10B 41/10* (2023.02); *H10B 43/10* (2023.02); *H10B 43/27* (2023.02)

(58) Field of Classification Search
None
See application file for complete search history.

(56) References Cited

U.S. PATENT DOCUMENTS

| | | | | |
|---|---|---|---|---|
| 2016/0268263 | A1* | 9/2016 | Lee | H10B 43/10 |
| 2017/0352673 | A1* | 12/2017 | Lee | H10B 43/27 |
| 2019/0027489 | A1* | 1/2019 | Orimoto | H10D 64/518 |
| 2020/0091188 | A1* | 3/2020 | Lee | H10B 41/27 |
| 2020/0135754 | A1* | 4/2020 | Lee | H10B 43/27 |
| 2020/0135755 | A1* | 4/2020 | Shin | H10B 41/10 |
| 2020/0202906 | A1* | 6/2020 | Russo | H10B 43/27 |

FOREIGN PATENT DOCUMENTS

KR    1020130059821 A    6/2013

* cited by examiner

*Primary Examiner* — Khaja Ahmad
(74) *Attorney, Agent, or Firm* — WILLIAM PARK AND ASSOCIATES LTD.

(57) ABSTRACT

A method of manufacturing a semiconductor memory device includes: forming a stack structure including interlayer insulating layers and sacrificial layers, which are alternately stacked; forming an upper insulating layer covering the stack structure; forming a preliminary isolation structure in the upper insulating layer; forming a slit penetrating the upper insulating layer and the stack structure; replacing the sacrificial layers with conductive patterns through the slit; and opening a preliminary trench structure defined in the upper insulating layer by removing the preliminary isolation structure.

12 Claims, 15 Drawing Sheets

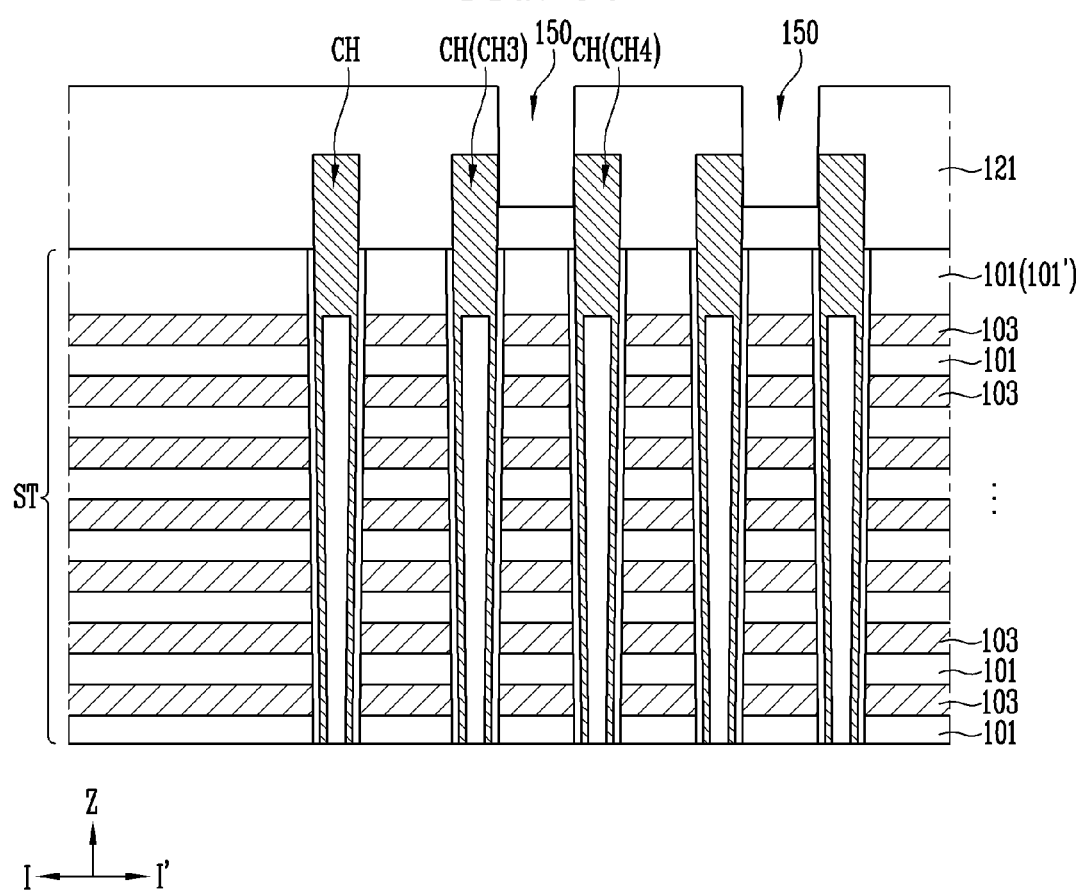

MANUFACTURING METHOD OF A SEMICONDUCTOR MEMORY DEVICE

CROSS-REFERENCE TO RELATED APPLICATION

The present application claims priority under 35 U.S.C. § 119(a) to Korean patent application number 10-2021-0165572 filed on Nov. 26, 2021, in the Korean Intellectual Property Office, the entire disclosure of which is incorporated by reference herein.

BACKGROUND

1. Technical Field

The present disclosure generally relates to a manufacturing method of a semiconductor memory device, and more particularly, to a manufacturing method of a three-dimensional semiconductor memory device.

2. Related Art

A semiconductor memory device may include a memory cell array including a plurality of memory cells. The memory cell array may include memory cells arranged in various structures. In order to improve the degree of integration of a semiconductor memory device, memory cells may be three-dimensionally arranged above a substrate. A stack structure in which a plurality of material layers are stacked may be used when a three-dimensional semiconductor memory device is manufactured.

SUMMARY

In accordance with an embodiment of the present disclosure, there is provided a method of manufacturing a semiconductor memory device, the method may include: forming a stack structure including interlayer insulating layers and sacrificial layers, which are alternately stacked; forming an upper insulating layer covering the stack structure; forming a preliminary isolation structure in the upper insulating layer; forming a slit penetrating the upper insulating layer and the stack structure; replacing the sacrificial layers with conductive patterns through the slit; and opening a preliminary trench structure defined in the upper insulating layer by removing the preliminary isolation structure.

BRIEF DESCRIPTION OF THE DRAWINGS

Various examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. It will be understood that when an element, structure, pattern, or layer etc., is referred to as being "on," "connected to" or "coupled to" another element, structure, pattern, or layer etc., it can be directly on, connected or coupled to the other element, structure, pattern, or layer etc., or intervening elements, patterns, or layers etc., may be present. In contrast, when an element, structure, pattern, or layer etc., is referred to as being "directly on," "directly connected to" or "directly coupled to" another element, structure, pattern, or layer etc., there are no intervening elements or layers present. Like reference numerals refer to like elements throughout.

FIGS. 5A, 5B, 5C, 5D, 5E, 5F, 5G, 5H, and 5I are sectional views illustrating a manufacturing method of a semiconductor memory device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the present disclosure.

Various embodiments provide a manufacturing method of a semiconductor memory device, which can improve electrical characteristics.

Figure 1A:
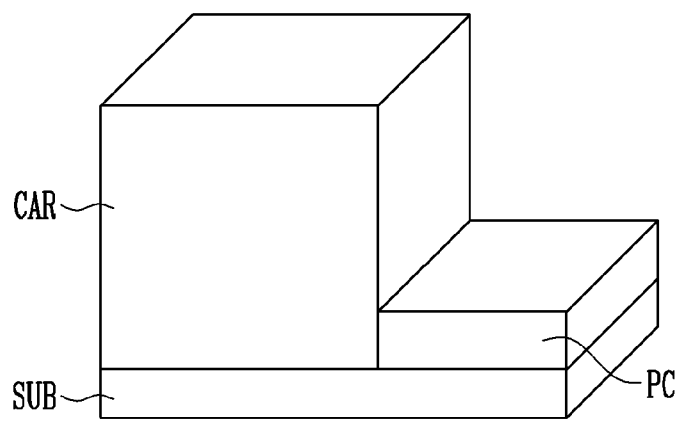
FIGS. 1A and 1B are block diagrams schematically illustrating semiconductor memory devices in accordance with embodiments of the present disclosure.
Figure 1B:
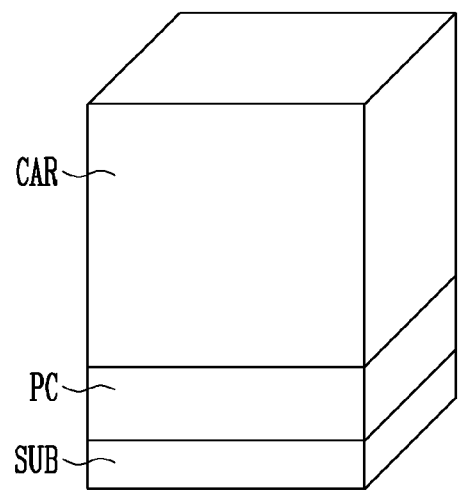

FIGS. 1A and 1B are block diagrams schematically illustrating semiconductor memory devices in accordance with embodiments of the present disclosure.

Referring to FIGS. 1A and 1B, each of the semiconductor memory devices in accordance with the embodiments of the present disclosure may include a peripheral circuit structure PC and a cell array CAR, which are disposed on a substrate SUB.

The substrate SUB may be a single crystalline semiconductor layer. For example, the substrate SUB may be a bulk silicon substrate, a silicon on insulator substrate, a germanium substrate, a germanium on insulator substrate, a silicon-germanium substrate, or an epitaxial thin film formed through a selective epitaxial growth process.

The cell array CAR may include a plurality of memory blocks. Each of the memory blocks may include a plurality of cell strings. Each of the cell strings is electrically connected to a bit line, a source line, word lines, and select lines. Each of the cell strings may include memory cells and select transistors, which are connected in series. Each of the select lines is used as a gate electrode of a select transistor corresponding thereto, and each of the word lines is used as a gate electrode of a memory cell corresponding thereto.

The peripheral circuit structure PC may include NMOS and PMOS transistors, a resistor, and a capacitor, which are electrically connected to the cell array CAR. The NMOS and PMOS transistors, the resistor, and the capacitor may be used as elements constituting a row decoder, a column decoder, a page buffer, and a control circuit.

As shown in FIG. 1A, the peripheral circuit structure PC may be disposed on a partial region of the substrate SUB, which does not overlap with the cell array CAR.

Alternatively, as shown in FIG. 1B, the peripheral circuit structure PC may be disposed between the cell array CAR and the substrate SUB. The peripheral circuit structure PC overlaps with the cell array CAR, and hence an area of the substrate SUB occupied by the cell array CAR and the peripheral circuit structure PC can be reduced.

Figure 2:
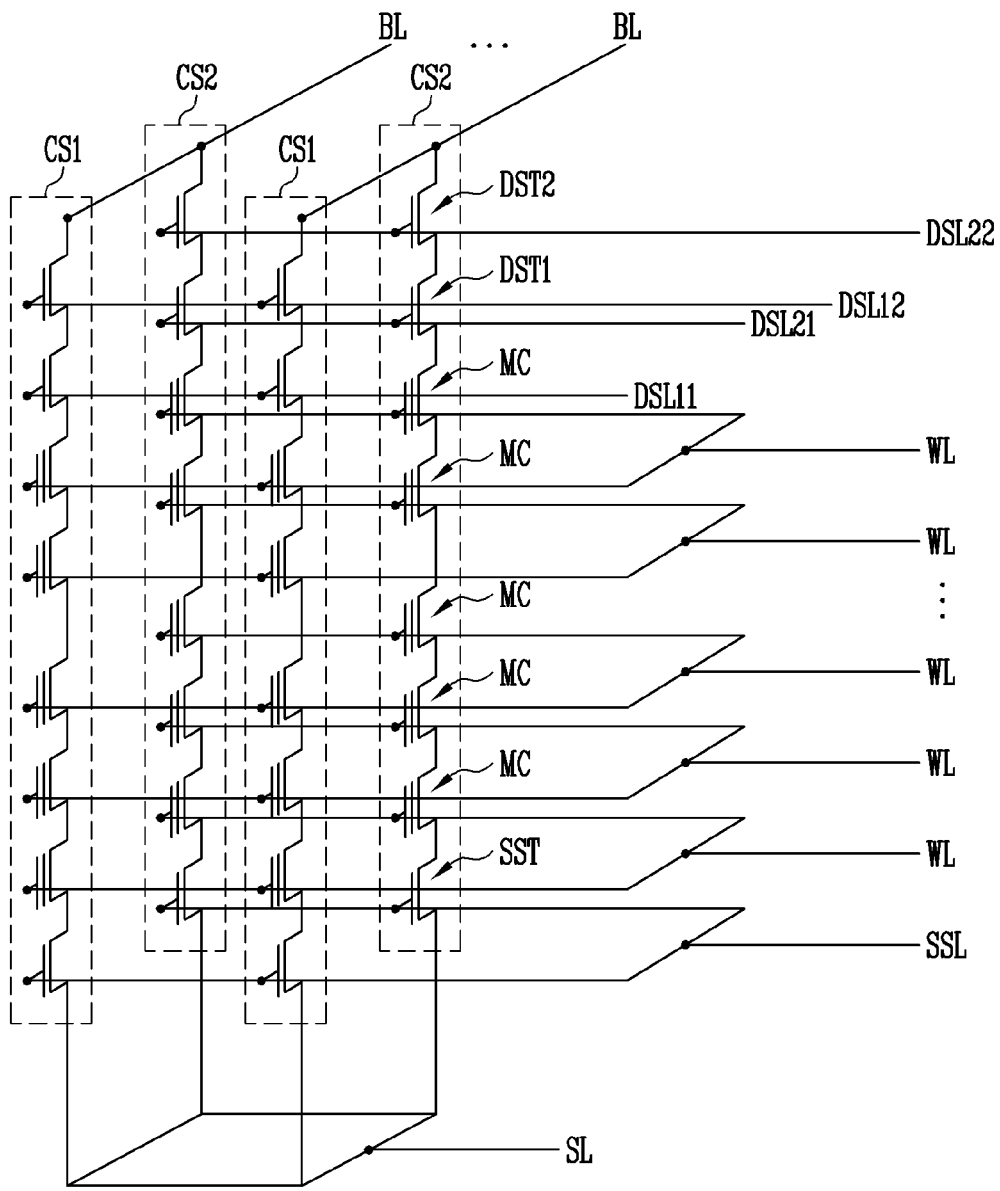
FIG. 2 is a schematic circuit diagram of a semiconductor memory device in accordance with an embodiment of the present disclosure.

FIG. 2 is a schematic circuit diagram of a semiconductor memory device in accordance with an embodiment of the present disclosure.

Referring to FIG. 2, the semiconductor memory device may include a plurality of cell strings CS1 and CS2 connected to a common source line SL. The cell strings CS1 and CS2 may be arranged on a plurality of rows and a plurality of columns. Cell strings CS1 and SC2 of each row may be connected to a plurality of bit lines BL.

Each of the cell strings CS1 and CS2 may include a plurality memory cells MC connected in series, a source select transistor SST, and drain select transistors DST1 and DST2. The source select transistor SST may control electrical connection between a cell string CS1 or CS2 corresponding thereto and the common source line SL. The drain select transistors DST1 and DST2 may control electrical connection between a cell string CS1 or CS2 corresponding thereto and a bit line BL corresponding thereto. Each of the cell strings CS1 and CS2 may include one drain select transistor or two or more drain select transistors connected in series. For example, FIG. 2 illustrates a case where each of the cell strings CS1 and CS2 includes a first drain select transistor DST1 and a second drain select transistor DST2, which are connected in series between a bit line BL and a plurality of memory cells MC.

The cell strings CS1 and CS2 may include a plurality of first cell strings CS1 and a plurality of second cell strings CS2. Each bit line BL may be connected to a pair of first and second cell strings CS1 and CS2 corresponding thereto among the plurality of first cell strings CS1 and the plurality of second cell strings CS2, to commonly control the pair of first and second cell strings CS1 and CS2.

The plurality of first cell strings CS1 and the plurality of second cell strings CS2 may be connected to conductive patterns DSL11, DSL12, DSL21, DSL22, WL, and SSL. The conductive patterns DSL11, DSL12, DSL21, DSL22, WL, and SSL may include first drain select lines DSL11 and DSL12, second drain select lines DSL21 and DSL22, word lines WL, and a source select line SSL.

The first drain select lines DSL11 and DSL12 may be individually connected to gate electrodes of a first drain select transistor DST1 and a second drain select transistor DST2, which constitute a first cell string CS1. The second drain select lines DSL21 and DSL22 may be individually connected to gate electrodes of a first drain select transistor DST1 and a second drain select transistor DST2, which constitute a second cell string CS2.

The source select line SSL may be connected to a gate electrode of a source select transistor SST, and the word lines WL may be respectively connected to gate electrodes of memory cells MC. Each of the source select line SSL and the word lines WL may be commonly connected to the plurality of first cell strings CS1 and the plurality of second cell strings CS2 to control the plurality of first cell strings CS1 and the plurality of second cell strings CS2.

According to the above-described structure, the first drain select lines DSL11 and DSL12 may be selected to perform a selective operation on only the first cell string CS1, and the second drain select lines DSL21 and DSL22 may be selected to perform a selective operation on only the second cell string CS2.

As described above, two or more cell strings may be connected to one bit line BL and the one word line WL, and drain select lines may be individually connected to two or more cell strings to individually control the two or more cell strings. For example, as shown in FIG. 2, a first cell string CS1 and a second cell string CS2 may be connected to one bit line BL and one word line WL. The first drain select lines DSL11 and DSL12 connected to the first cell string CS1 may be separated from each other to individually control the first cell string CS1 and the second cell string CS2.

Figure 3A:
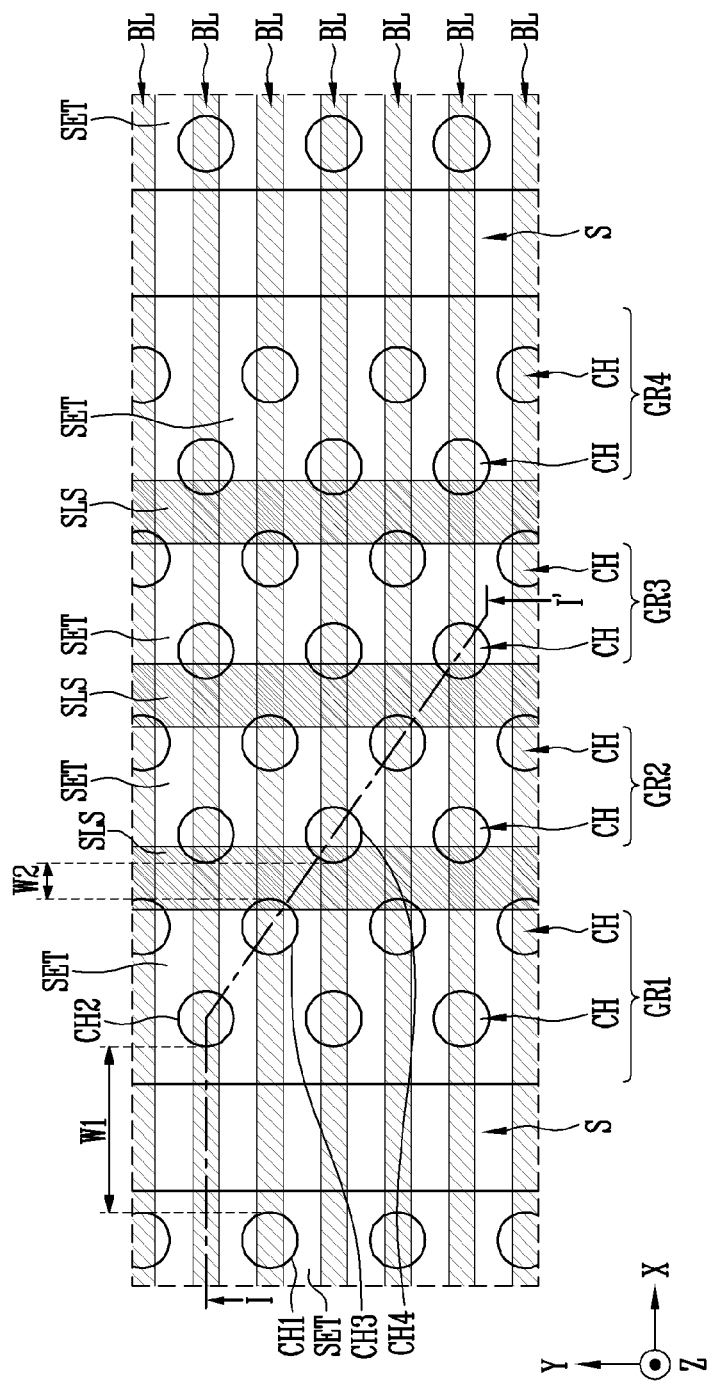
FIGS. 3A and 3B are plan views illustrating a layout of a semiconductor memory device in accordance with an embodiment of the present disclosure.
Figure 3B:
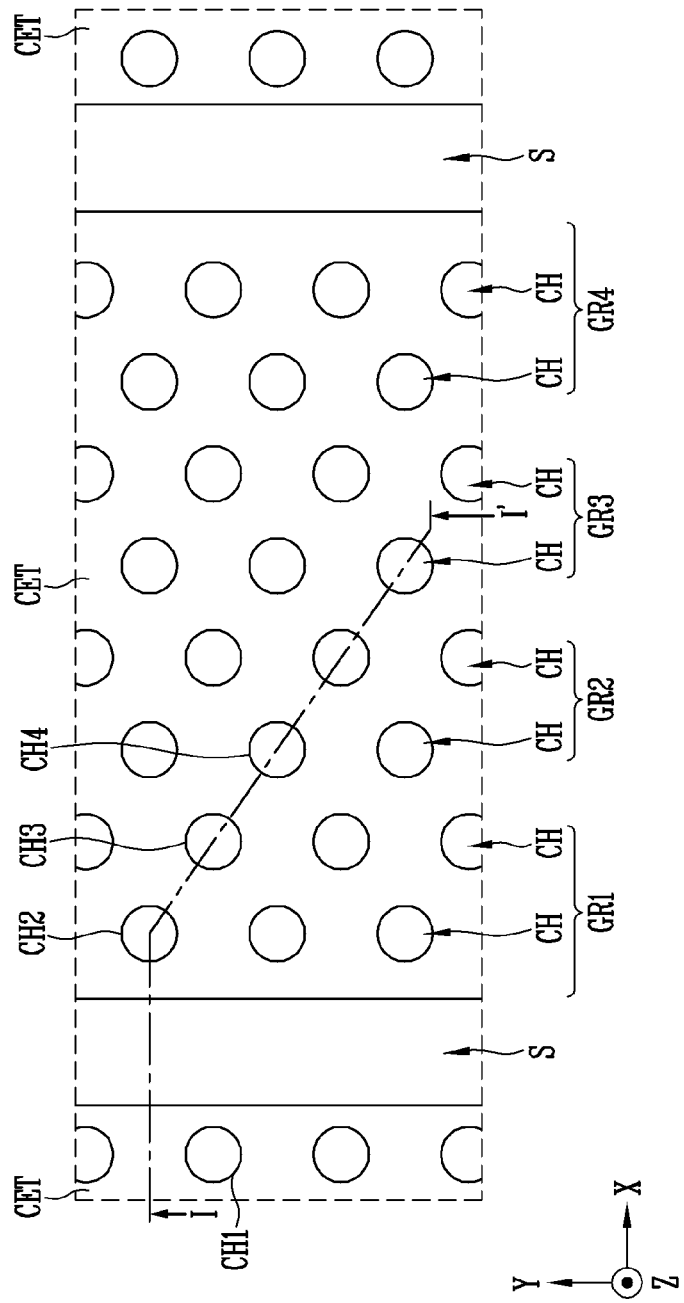

FIGS. 3A and 3B are plan views illustrating a layout of a semiconductor memory device in accordance with an embodiment of the present disclosure. Each of structures shown in FIGS. 3A and 3B may be included in the cell array CAR shown in FIG. 1A or 1B.

Referring to FIGS. 3A and 3B, the semiconductor memory device in accordance with the embodiment of the present disclosure may include select stack structures SET and cell stack structures CET. FIG. 3A illustrates a layout of the select stack structures SET, and FIG. 3B illustrates a layout of the cell stack structures CET. Hereinafter, a first horizontal direction X, a second horizontal direction Y, and a vertical direction Z may be defined as directions facing axes intersecting one another. In an embodiment, the first horizontal direction X, the second horizontal direction Y, and the vertical direction Z may be defined as X-axis, Y-axis, and Z-axis directions of an XYX coordinate system.

The select stack structures SET may overlap with the cell stack structure CET.

The select stack structures SET may be isolated from each other by slits S and select line isolation structures SLS. One or more select line isolation structures SLS may be disposed between slits S adjacent to each other in the first horizontal direction X. For example, one select line separation structure SLS may be disposed between slits S adjacent to each other in the first horizontal direction X. In another example, two or more select line isolation structures SLS may be disposed between slits S adjacent to each other in the first horizontal direction X.

The slits S may extend between cell stack structures CET. Each of the cell stack structures CET may extend in the first horizontal direction X between slits S adjacent to each other. Each cell stack structure CET may overlap with two or more select stack structures SET and a select line isolation structure SLS isolating the same from each other.

Each of the select stack structures SET and the cell stack structures CET may extend in the first horizontal direction X and the second horizontal direction Y. Each of the select stack structures SET and the cell stack structures CET may include interlayer insulating layers and conductive pattern, which are stacked in the vertical direction Z. A stacked structure of the interlayer insulating layers and the conductive pattern will be described later with reference to FIG. 4. Conductive patterns of the select stack structures SET may constitute the first drain select lines DSL11 and DSL12 and the second drain select lines DSL21 and DSL22, which are described with reference to FIG. 2. Conductive patterns of the cell stack structures CET may constitute the word lines WL described with reference to FIG. 2.

Each of the slits S and the select line isolation structures SLS may extend in the second horizontal direction Y. Channel structures CH may be disposed at both sides of each of the select line isolation structures SLS. Each of the channel structures CH may extend in the vertical direction Z, and penetrate the select stack structures SET and the cell stack structures CET. Channel structures CH disposed between slits S adjacent to each other may be divided into a plurality of channel groups (e.g., GR1 to GR4) by the select line isolation structures SLS. Channel groups GR1 to GR4 shared by one cell stack structure CET may be individually controlled respectively by select stack structures SET isolated from each other by at least one select line isolation structure SLS. Each channel group GR1, GR2, GR3 or GR4 may include channel structures CH of one column or more.

Channels adjacent to each other with the slit S interposed therebetween may be divided into a first channel structure CH1 and a second channel structure CH2. Channels adjacent to each other with the select line isolation structure SLS interposed therebetween may be divided into a third channel structure CH3 and a fourth channel structure CH4. A distance between the first channel structure CH1 and the second channel structure CH2 may be defined as a first distance W1, and a distance between the third channel structure CH3 and the fourth channel structure CH4 may be defined as a second distance W2. In an embodiment, the distance between the first channel structure CH1 and the second channel structure CH2 may be formed as the first distance W1 wider than the second distance W2.

According to the above-described structure, a number of channel structures CH shared by each select stack structure SET is less than a number of channel structures CH shared by each cell stack structure CET.

A width of each select line isolation structure SLS may be formed different from a width of each slit S. More specifically, each select line isolation structure SLS may be formed narrower in the first horizontal direction X than each slit S.

The channel structures CH may be disposed in zigzag. However, the present disclosure is not limited thereto. In an embodiment, the channel structures CH may be arranged in parallel in the first horizontal direction X and the second horizontal direction Y.

The channel structures CH may be connected to bit lines BL. The bit lines BL may be disposed to be spaced apart from the select stack structure SET in the vertical direction Z, and be disposed on the select stack structure SET. The bit lines BL may extend in the first horizontal direction X. The bit lines BL may be arranged to be spaced apart from each other in the second horizontal direction Y. Each of the bit lines BL may be electrically connected to the channel structures CH through bit line contacts (not shown). The bit lines BL may include a conductive material. In an example, the bit lines BL may include a tungsten, aluminum or copper.

Figure 4:
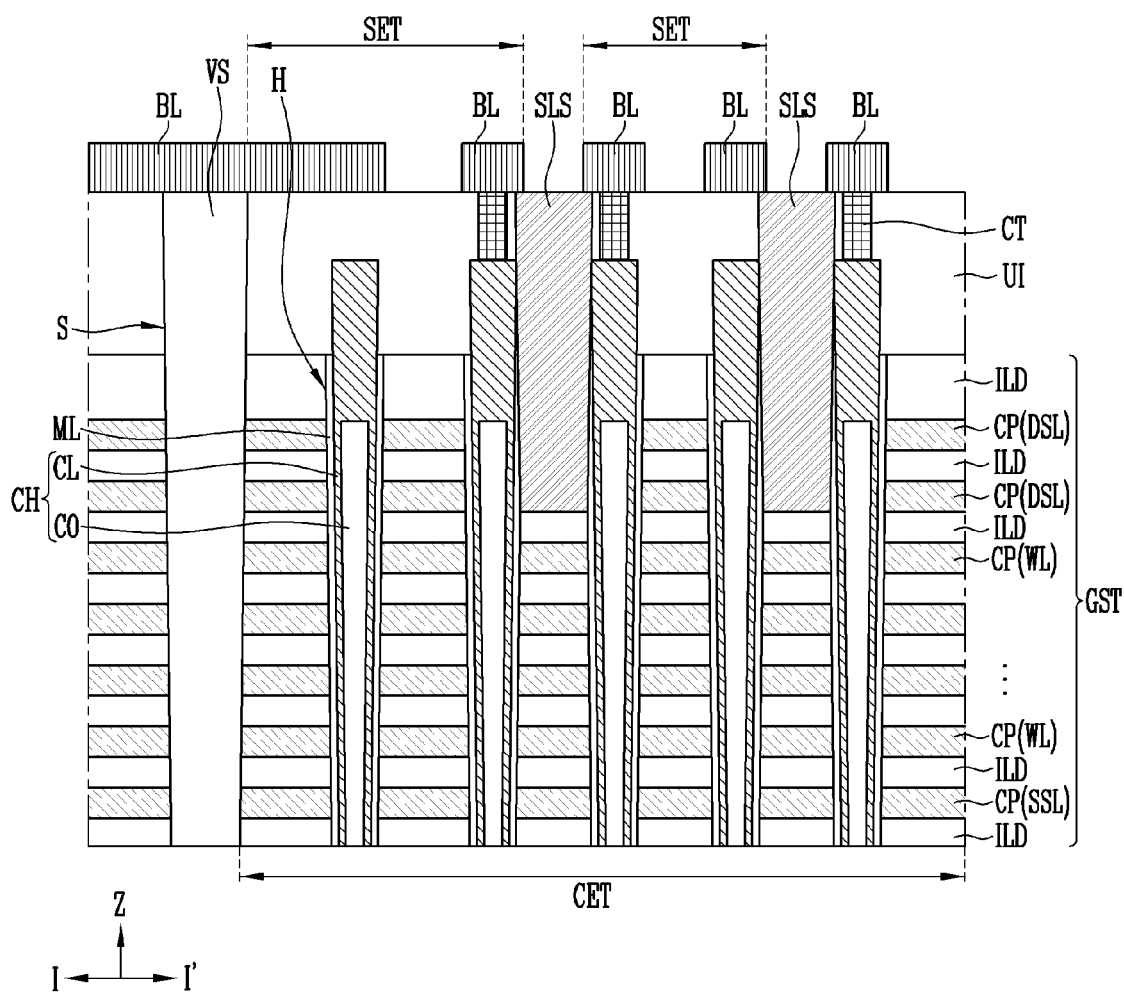
FIG. 4 is a sectional view illustrating a semiconductor memory device in accordance with an embodiment of the present disclosure.

FIG. 4 is a sectional view illustrating a semiconductor memory device in accordance with an embodiment of the present disclosure.

FIG. 4 illustrates a stacked structure of the select stack structures SET shown in FIG. 3A and the cell stack structures CET shown in FIG. 3B. FIG. 4 illustrates a section of the semiconductor memory device taken along line I-I' shown in FIGS. 3A and 3B.

Referring to FIG. 4, the semiconductor memory device in accordance with the embodiment of the present disclosure may include a gate stack structure GST. The gate stack structure GST may include interlayer insulating layers ILD and conductive patterns CP, which are alternately stacked in the vertical direction Z. Each of the interlayer insulating layers ILD and the conductive patterns CP may extend in the second horizontal direction Y shown in FIGS. 3A and 3B.

The gate stack structure GST may be divided into a cell stack structure CET and select stack structures SET. In other words, the interlayer insulating layers ILD and the conductive patterns CP may be divided into patterns constituting the cell stack structure CET and patterns constituting the select stack structures SET. The select stack structures SET may be stacked on the cell stack structure CET, and be spaced apart from each other in the first horizontal direction X as shown in FIG. 3A.

A select line isolation structure SLS may be disposed inside the gate stack structure GST. The select line isolation structure SLS isolates the select stack structures SET from each other. A boundary of the gate stack structure GST may be partitioned by a slit S. The slit S may extend in the vertical direction Z to define a sidewall of the cell stack structure CET. The slit S may extend up to a height at which the select stack structures SET are disposed. Accordingly, the slit S may define a sidewall of a side stack structure adjacent to the slit S among the select stack structures SET.

The slit S may be filled with a vertical structure VS. The vertical structure VS may include only an insulating material or include an insulating material and a conductive material penetrating the insulating material. The select line isolation structure SLS may be configured with an insulating material.

The select line isolation structure SLS may penetrate a pattern disposed in at least an uppermost layer among the conductive patterns CP of the gate stack structure GST. However, the present disclosure is not limited thereto.

For example, the select line isolation structure SLS may penetrate a pattern disposed in an uppermost layer and one or more patterns consecutively disposed thereunder among the conductive patterns CP of the gate stack structure GST. Multi-layer patterns among the conductive patterns CP are not penetrated by the select line isolation structure SLS but may extend to overlap with the select line isolation structure SLS. Conductive patterns CP of the cell stack structure CET, which are not penetrated by the select line isolation structure SLS, may be used as a source select line and word lines WL. Conductive patterns CP of the select stack structures SET isolated by the select line isolation structure SLS may be used as drain select lines DSL.

Each of the conductive patterns CP and the interlayer insulating layers ILD may surround channel structures CH. Each of the channel structures CH may include a semiconductor material such as silicon. The channel structure CH may include a core insulating layer CO, a channel layer CL, and a memory layer ML. The channel structure CH may include a liner pattern surrounding a sidewall of the core insulating layer CO and a capping pattern disposed on the core insulating layer CO. The capping pattern of the channel structure CH may include a conductivity type impurity. In an embodiment, the conductivity type impurity may include an n-type impurity.

The memory layer ML surrounding the channel layer may include a tunnel insulating layer, a data storage layer, and a blocking insulating layer, which are sequentially stacked on a surface of the channel layer. The data storage layer may include a material layer capable of storing data changed using Fowler-Nordheim tunneling. To this end, the data storage layer may be formed of various materials. For example, the data storage layer may be formed of nitride layer in which charges can be trapped. However, the present disclosure is not limited thereto, and the data storage layer may include silicon, a phase change material, a nano dot, and the like. The blocking insulating layer may include an oxide layer capable of blocking movement of charges. The tunnel insulating layer may include a silicon oxide layer through which charges can tunnel.

A memory layer ML may be disposed between each channel structure CH and the gate stack structure GST. The memory layer ML may extend along a sidewall of a channel structure CH corresponding thereto. However, the present disclosure is not limited thereto.

Although not shown in the drawing, in an embodiment, the memory layer ML may be disposed on a sidewall of each of the conductive patterns CP facing the channel structures CH, and extend along interfaces between each conductive pattern CP and interlayer insulating layers ILD adjacent thereto. The memory layer ML may have a C-shaped sectional structure opened toward the select line isolation structure SLS or the slit SL.

Each of the conductive patterns CP may include at least one of a silicon layer, a metal silicide layer, a metal layer, and a metal nitride layer. Each of the conductive patterns CP may include a metal such as tungsten (W) so as to achieve low resistance wiring. A barrier layer (not shown) may be further formed, which is used to prevent a direct contact between each of the conductive patterns CP and interlayer insulating layers ILD adjacent thereto and a direct contact between each of the conductive patterns CP and the memory layer ML. The barrier layer may be formed of a metal oxide layer. For example, the barrier layer may include a titanium nitride layer, a tungsten nitride layer, or a tantalum nitride layer.

Each of the interlayer insulating layers ILD may be formed of various insulating materials. For example, each of the interlayer insulating layers ILD may include a silicon oxide layer.

The channel structures CH may further protrude in the vertical direction Z than the gate stack structure GST. The channel structures CH and the gate stack structure GST may be covered by an upper insulating layer UI. The slit S and the vertical structure VS therein may extend in the vertical direction Z to penetrate the upper insulating layer UI. The select line isolation structure SLS may extend in the vertical direction Z to penetrate the upper insulating layer UI.

Contact plugs CT may be respectively in contact with the channel structures CH while penetrating the upper insulating layer UI overlapping with the channel structures CH. The contact plugs CT may be formed of various conductive materials. In an embodiment, each of the contact plugs CT may include titanium nitride (TiN) and tungsten (W).

Bit lines BL may electrically connect the contact plugs CT to the channel structures CH. The bit lines BL may include a conductive material. In an example, the bit lines BL may include tungsten, aluminum or copper.

FIGS. 5A to 5I are sectional views illustrating a manufacturing method of a semiconductor memory device in accordance with an embodiment of the present disclosure. FIGS. 5A to 5I are process sectional views taken along the line I-I' shown in each of FIGS. 3A and 3B.

Figure 5A:
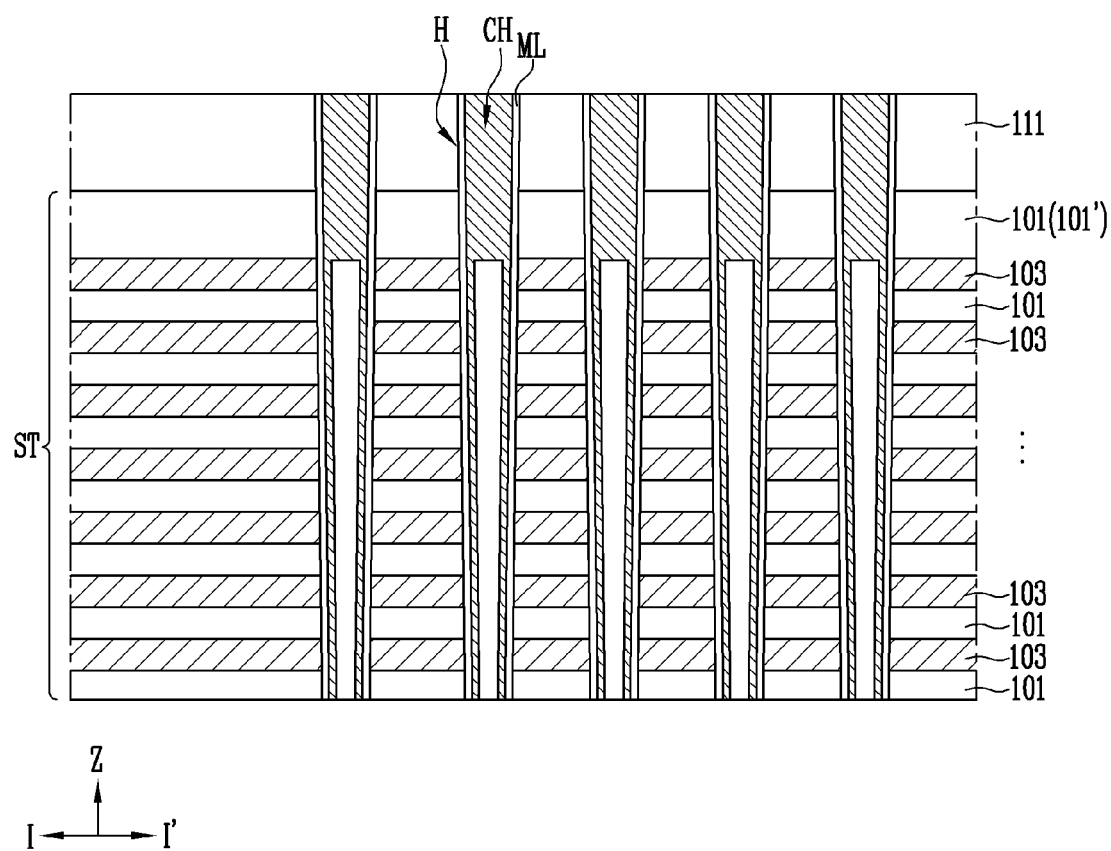

Referring to FIG. 5A, a stack structure ST penetrated by channel structures CH is formed. The stack structure ST may be formed on a doped semiconductor layer (not shown). The manufacturing method may include a process of forming the stack structure ST by alternately stacking interlayer insulating layers 101 and sacrificial layers 103, a process of forming a mask layer 111 on an interlayer insulating layer 101' existing in an uppermost layer of the stack structure ST, and a process of forming the channel structures CH penetrating the stack structure ST and the mask layer 111.

The stack structure ST may include the interlayer insulating layer 101 and the sacrificial layers 103, which are alternately stacked in the vertical direction Z. The interlayer insulating layers 101 may be formed of a material different from a material of the sacrificial layers 103, and the interlayer insulating layers 101 and the sacrificial layers 103 may have different etching rates. In an embodiment, the interlayer insulating layer 101 may be formed as a silicon oxide layer, and the sacrificial layer 103 may be formed as a silicon nitride layer.

The process of forming the channel structures CH may include a process of forming holes H penetrating the mask layer 111 and the stack structure ST and a process of filling the holes H respectively with the channel structures CH. The manufacturing method may further include a process of forming a memory layer ML on a surface of each of the holes H, before the channel structures CH are formed. The channel structures CH may be formed on the memory layer ML.

Figure 5B:
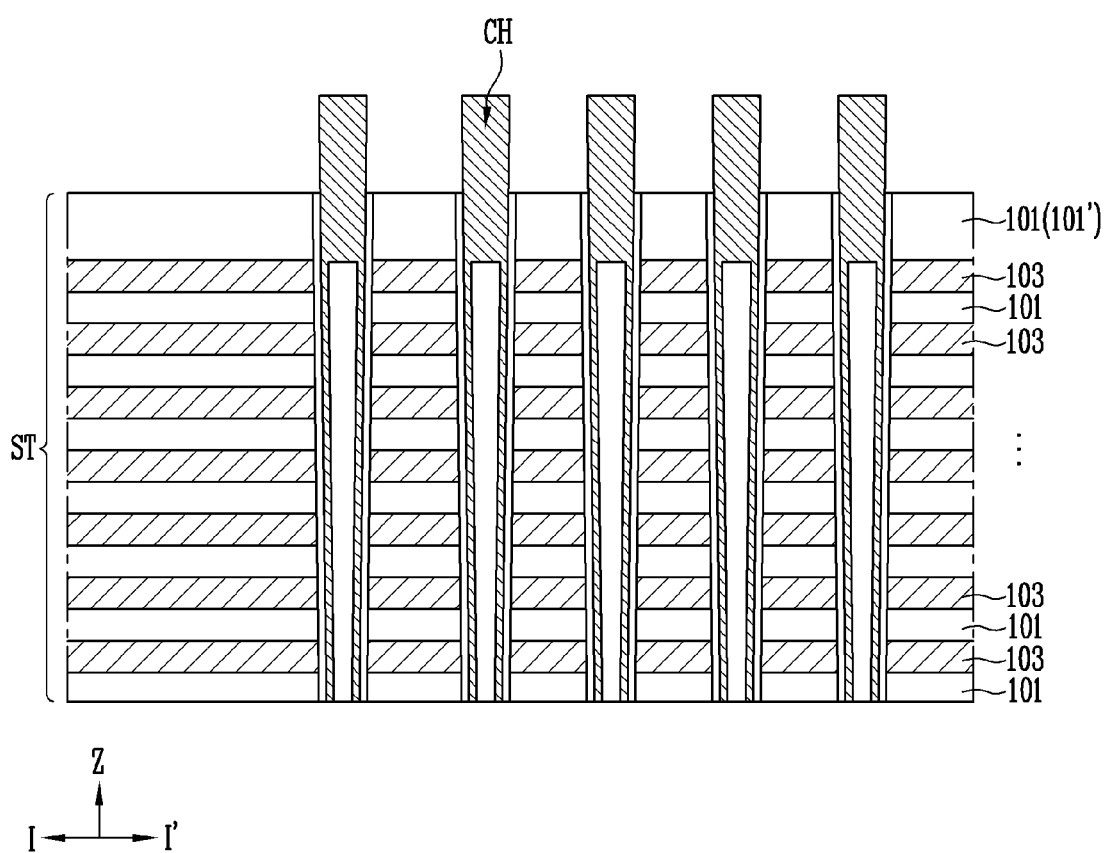

Referring to FIGS. 5A and 5B, the mask layer 111 may be removed such that the interlayer insulating layer 101' in the uppermost layer is exposed. In this process, the memory layer ML of the channel structures CH may be partially removed. However, the present disclosure is not limited thereto.

Referring to FIG. 5C, an upper insulating layer 121 is formed on the interlayer insulating layer 101' in the uppermost layer. Subsequently, preliminary trench structures 150 are formed by etching the upper insulating layer 121. Each of the preliminary trench structures 150 may be formed in a region in which a top end of the select line isolation structure SLS shown in FIG. 3A is to be disposed, and extend in the second horizontal direction Y shown in FIG. 3A. The preliminary trench structures 150 may be disposed between the channel structures CH.

In an embodiment, the channel structures CH may include a first channel structure CH1 and a second channel structure CH2, which are spaced apart from each other at a first distance W1, and a third channel structure CH3 and a fourth channel structure CH4, which are spaced apart from each other at a second distance W2 as described with reference to FIG. 3A. The preliminary trench structure 150 extend toward stack structure ST from a top surface of the upper insulating layer 121, and may be formed to a depth in which the preliminary trench structure 150 does not penetrate an interface between the upper insulating layer 121 and the stack structure ST.

Figure 5D:
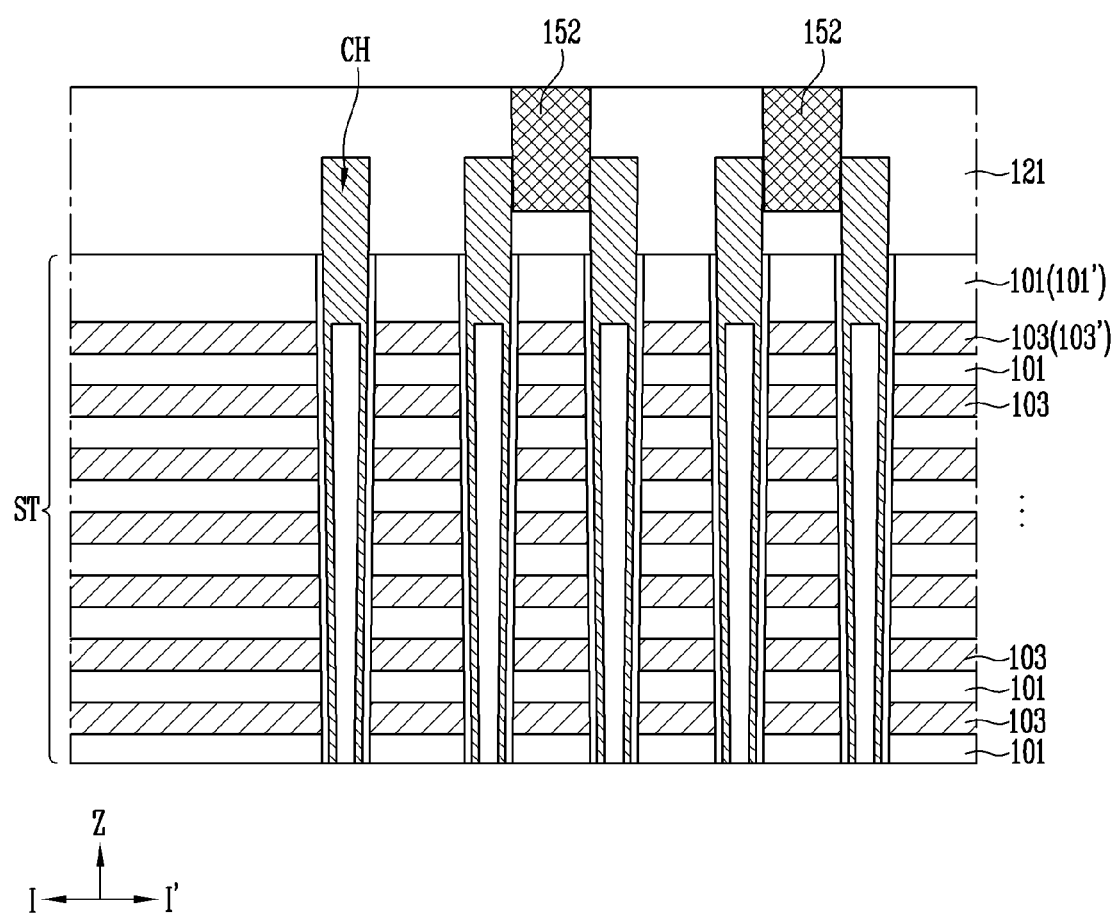

Referring to FIGS. 5C and 5D, the preliminary trench structure 150 may be filled with a preliminary isolation structure 152. The preliminary isolation structure 152 may include a material having an etching selectivity higher than an etching selectivity of the upper insulating layer 121 during a subsequent etching process. In an embodiment, the upper insulating layer 121 may be configured with oxide, and the preliminary isolation structure 152 may include at least one of nitride and metal.

The preliminary isolation structure 152 may extend toward the stack structure ST from the top surface of the upper insulating layer 121, and have a depth in which the preliminary isolation structure 152 does not penetrate the stack structure ST. The preliminary isolation structure 152 may have a bottom surface between a sacrificial layer 103' most adjacent to the upper insulating layer 121 among the sacrificial layers 103 and the upper insulating layer 121. The preliminary isolation structure 152 may be disposed to be spaced apart from the sacrificial layer 103' most adjacent to the upper insulating layer 121 among the sacrificial layers 103.

Figure 5E:
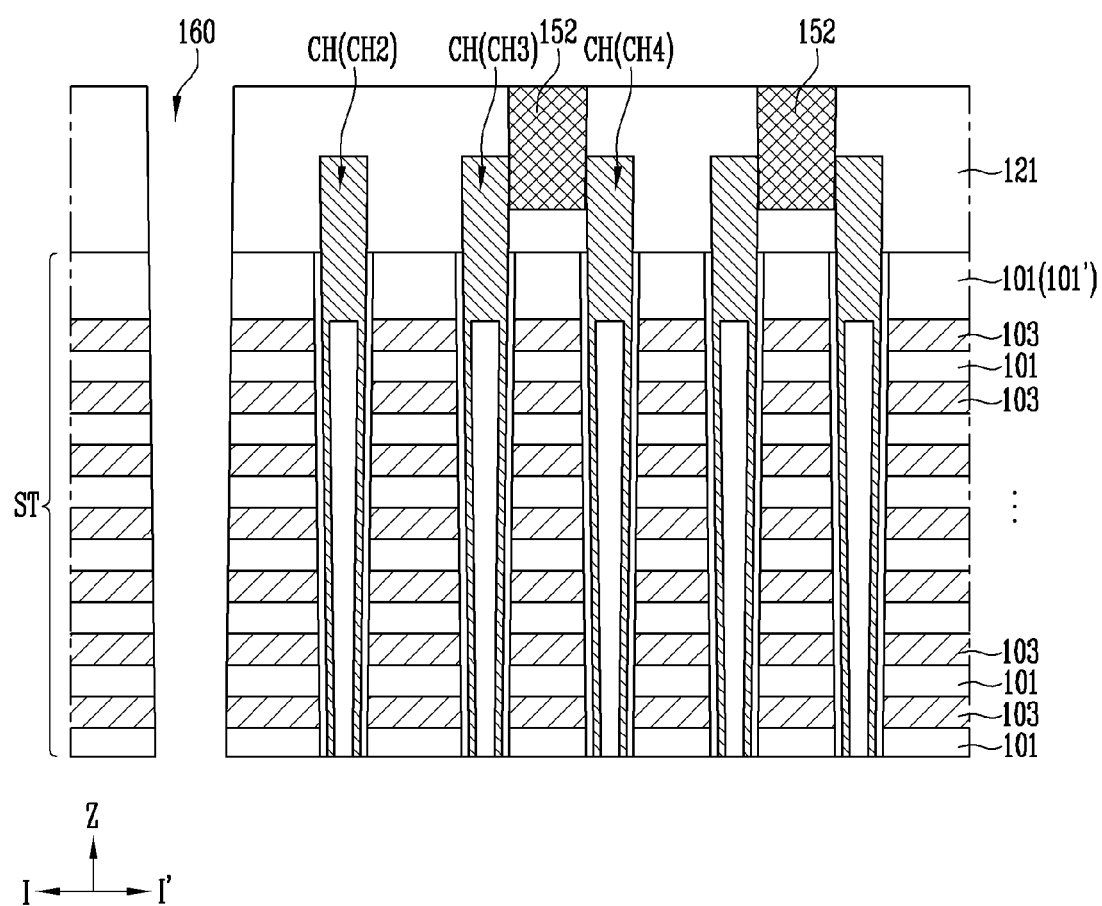

Referring to FIG. 5E, after the preliminary isolation structure 152 is formed, a slit 160 may be formed. The slit 160 is formed to a depth in which the slit 160 penetrates the upper insulating layer 121 and the stack structure ST. That is, the slit 160 may be formed deeper than the preliminary isolation structure 152. Although not shown in the drawing, a mask layer serving as an etching barrier may be disposed on the upper insulating layer 121 and the preliminary isolation structure 152 during an etching process for forming the slit 160.

The slit 160 penetrates the stack structure ST between the first channel structure CH1 and the second channel structure CH2 as shown in FIG. 3A. The preliminary isolation structure 152 overlaps with a position between the third channel structure CH3 and the fourth channel structure CH4 as shown in FIG. 3A.

Figure 5F:
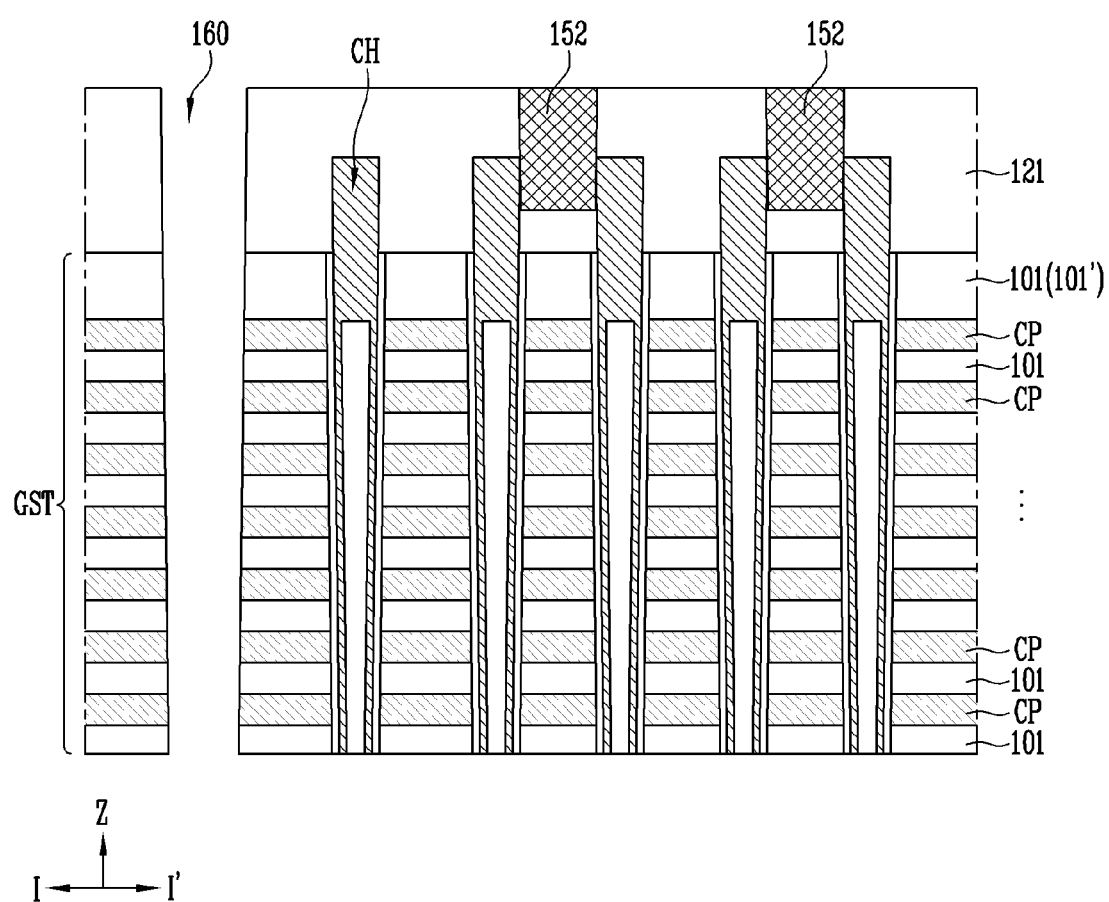

Referring to FIG. 5F, the sacrificial layers 103 are removed through the slit 160. Interlayer spaces in which the sacrificial layers 103 are removed may be filled with conductive patterns CP. The conductive patterns CP may include at least one of metal, metal silicide, metal nitride, and a doped silicon layer. Each of the conductive patterns CP may include a low resistance metal such as tungsten to achieve low resistance wiring. After the conductive patterns CP, the mask layer which has been provided to form the slit 160, is removed, thereby exposing the upper insulating layer 121 and the preliminary isolation structure 152.

The conductive patterns CP may apply stress to a gate stack structure GST. In accordance with an embodiment of the present disclosure, the preliminary isolation structure 152, before the conductive patterns CP are formed. Accordingly, an alignment position defect of the preliminary isolation structure 152 due to the stress applied by the conductive patterns CP can be reduced. For example, unlike the embodiment of the present disclosure, the preliminary isolation structure 152 may be formed after the conductive patterns CP are formed. The gate stack structure GST may be bent by the stress which the conductive patterns CP apply to the gate stack structure GST.

When the preliminary isolation structure 152 is formed after the gate stack structure GST is bent, an alignment position defect of the preliminary isolation structure 152 may occur, and a process for position correction of the preliminary isolation structure 152 may be added. In accordance with an embodiment of the present disclosure, after the preliminary isolation structure 152 is aligned in advance at a position between the channel structures CH, the conductive patterns CP are formed, and thus the alignment position defect of the preliminary isolation structure 152, which is caused by the stress applied by the conductive patterns CP, can be reduced.

Figure 5G:
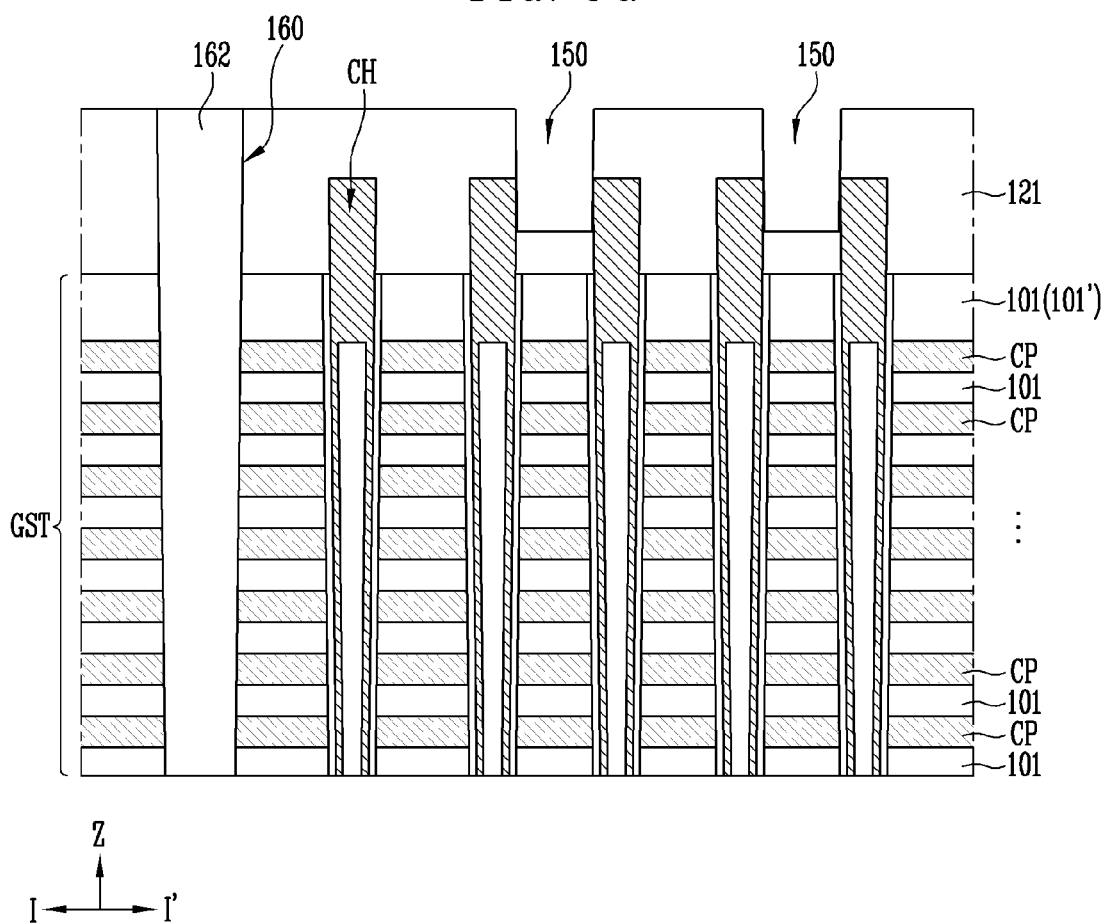

Referring to FIG. 5G, a vertical structure 162 filling the slit 160 is formed. The vertical structure 162 may include only an insulating material or include an insulating material and a conductive material penetrating the insulating material. Subsequently, only the preliminary isolation structure 152 may be removed, so that the preliminary trench structure 150 defined in the upper insulating layer 121 is opened.

Figure 5H:
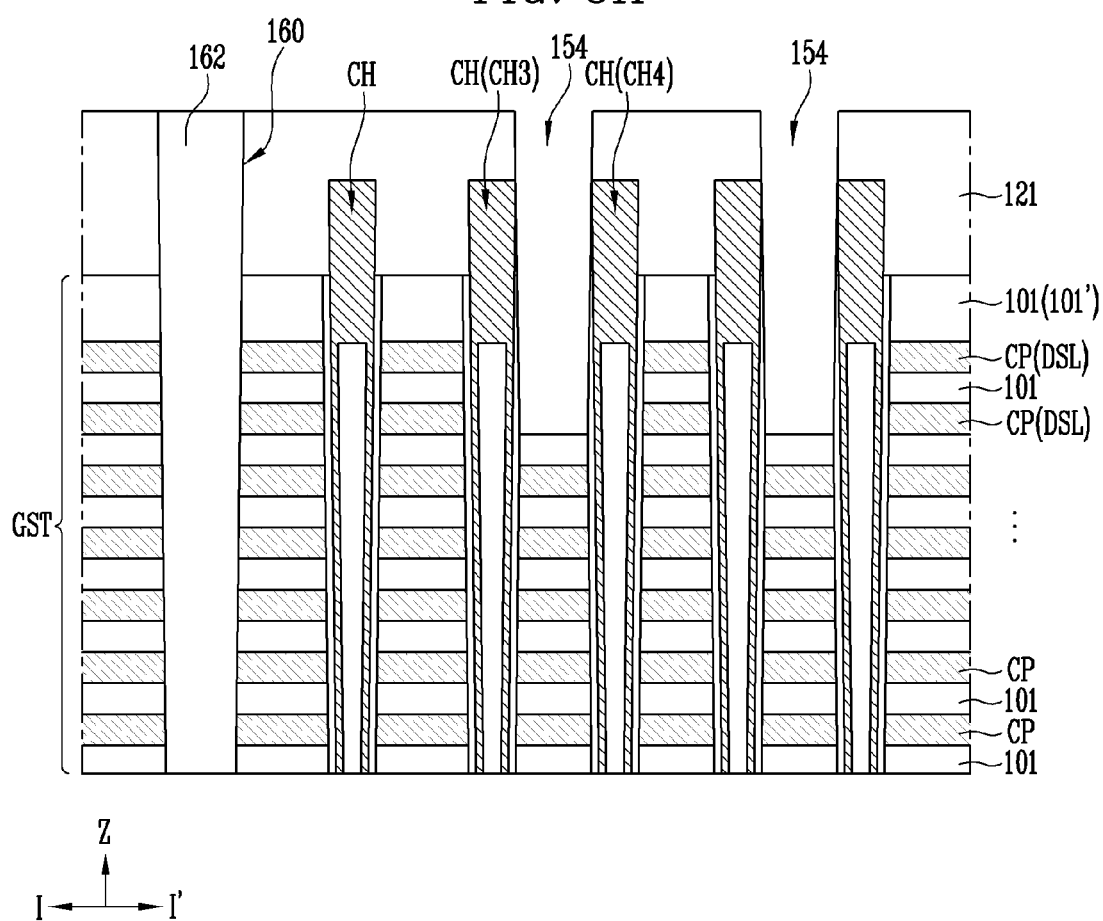

Referring to FIGS. 5G and 5H, trenches 154 penetrating at least one layer among the conductive patterns CP may be formed through the opened preliminary trench structure 150. At least one conductive pattern adjacent to the upper insulating layer 121 among the conductive patterns CP may be isolated into a drain select line DSL surrounding the third channel structure CH3 and a drain select line DSL surrounding the fourth channel structure CH4. Although any separate mask process is not performed to achieve the isolation into the drain select lines DSL, the trench 154 can be self-aligned between the third channel structure CH3 and the fourth channel structure CH4.

Figure 5I:
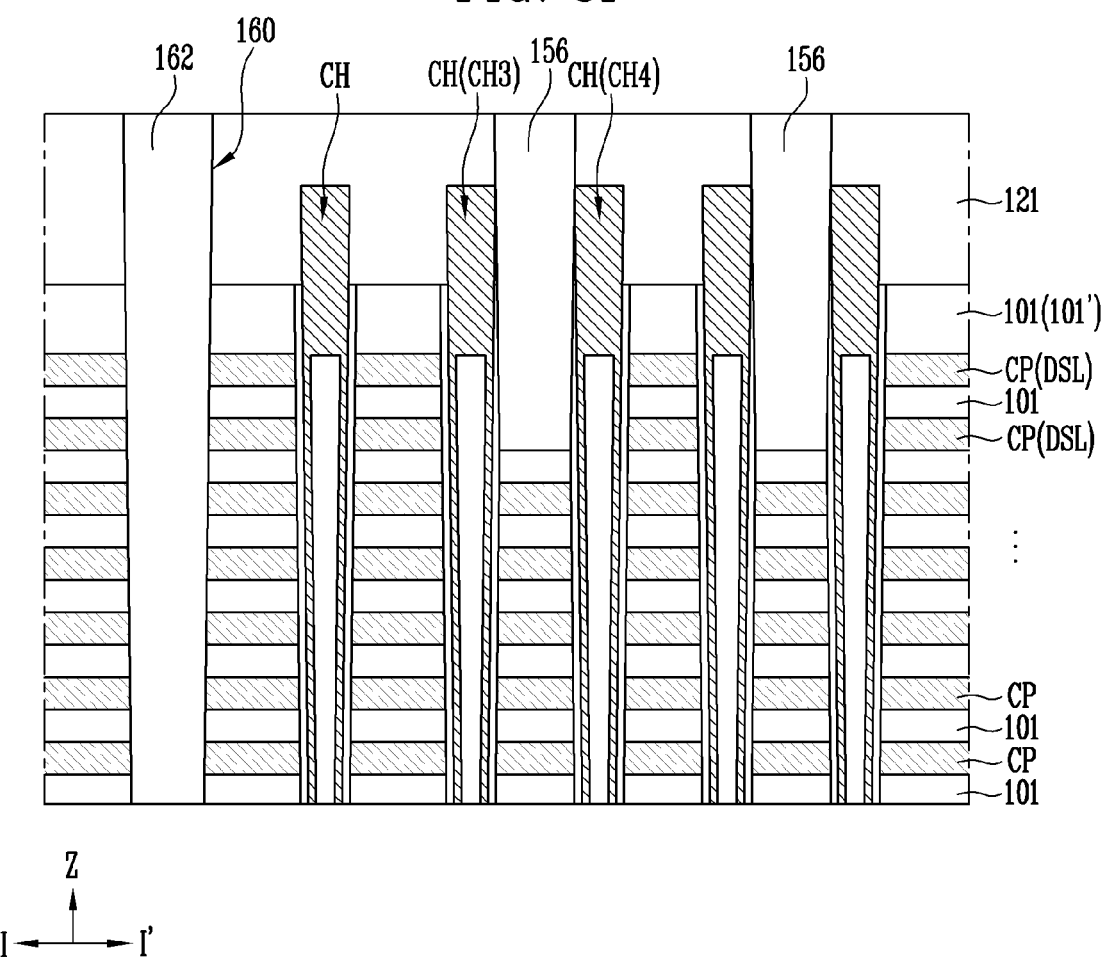

Referring to FIGS. 5H and 5I, the trench 154 may be filled with a select line isolation structure 156. The select line isolation structure 156 may include an insulating material.

Figure 6:
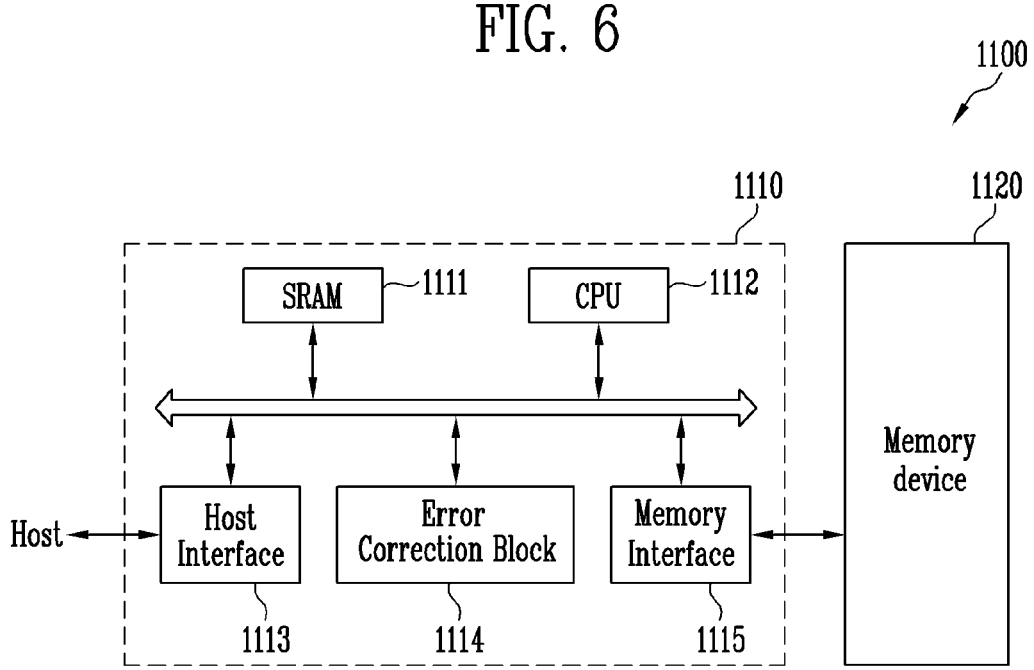
FIG. 6 is a block diagram illustrating a configuration of a memory system in accordance with an embodiment of the present disclosure.

FIG. 6 is a block diagram illustrating a configuration of a memory system in accordance with an embodiment of the present disclosure.

Referring to FIG. 6, the memory system 1100 includes a memory device 1120 and a memory controller 1110.

The memory device 1120 may be a multi-chip package configured with a plurality of flash memory chips. The memory device 1120 may include a word line configured to commonly control a first cell string and a second cell string. The word line may surround a channel structure of the first cell string and a channel structure of the second cell string. The memory device 1120 may include a first drain select line and a second drain select line, which overlap with the above-described word line and are configured to individually control the first cell string and the second cell string. The first drain select line may surround the channel structure of the first cell string, and the second drain select line may surround the channel structure of the second cell string. The first drain select line and the second drain select line may be isolated from each other. The processes described above in FIGS. 5A to 5I may be used to isolate the first drain select line and the second drain select line from each other.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects an error included in a data read from the memory device 1120, and corrects the detected error. The memory interface 1115 interfaces with the memory device 1120. The memory controller 1110 may further include a Read Only Memory (ROM) for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 7:
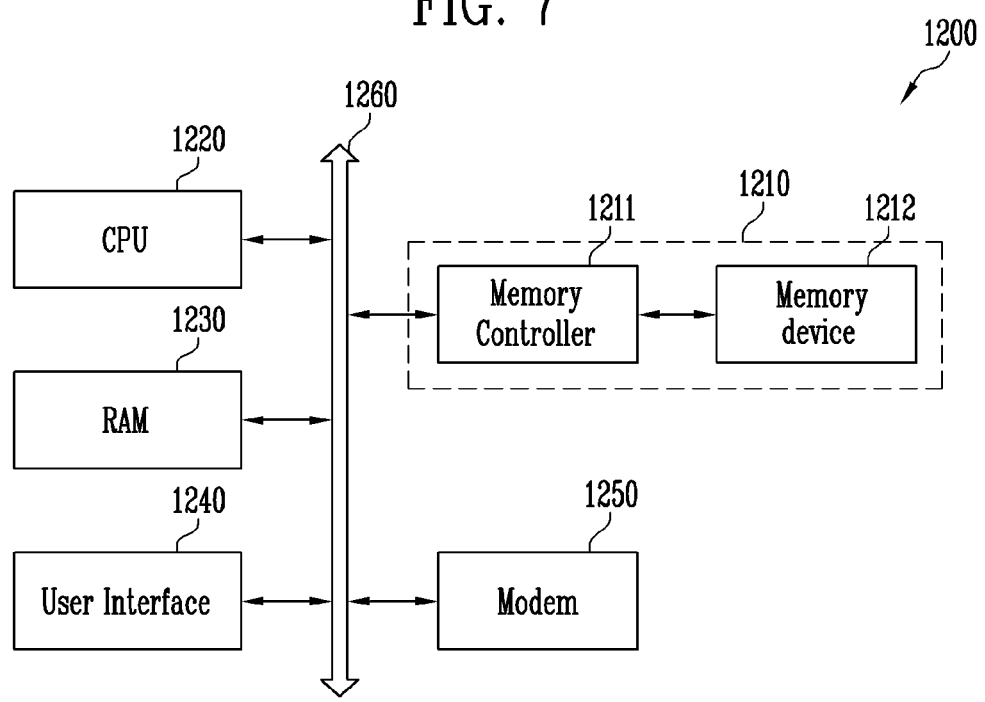
FIG. 7 is a block diagram illustrating a configuration of a computing system in accordance with an embodiment of the present disclosure.

FIG. 7 is a block diagram illustrating a configuration of a computing system in accordance with an embodiment of the present disclosure.

Referring to FIG. 7, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile DRAM, and the like may be further included.

The memory system 1210 may be configured with a memory device 1212 and a memory controller 1211.

The memory device 1212 may be configured identically to the memory device 1120 described above with reference to FIG. 6.

The memory controller 1211 may be configured identically to the memory controller 1110 described above with reference to FIG. 6.

In accordance with an embodiment of the present disclosure, a select line isolation process may be performed by being divided into a first process before sacrificial layers of a stack structure are replaced with conductive patterns and a second process after the sacrificial layers are replaced with the conductive patterns. Accordingly, in an embodiment, structural degradation of the semiconductor memory device is reduced, and thus electrical characteristics of the semiconductor memory device can be improved.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method of manufacturing a semiconductor memory device, the method comprising:
   forming a stack structure including interlayer insulating layers and sacrificial layers, which are alternately stacked;
   forming an upper insulating layer covering the stack structure;
   forming a preliminary trench structure in the upper insulating layer;
   forming a slit penetrating the upper insulating layer and the stack structure;
   replacing the sacrificial layers with conductive patterns through the slit; and
   forming a trench by extending the preliminary trench structure into the stack structure,
   wherein the conductive patterns include at least one drain select line,
   wherein the preliminary trench structure does not penetrate the at least one drain select line, and
   wherein the trench penetrates the at least one drain select line.

2. The method of claim 1, further comprising:
   forming a preliminary isolation structure in the preliminary trench structure; and
   after the sacrificial layers are replaced with the conductive patterns, removing the preliminary isolation structure to open the preliminary trench structure.

3. The method of claim 1,
   wherein a depth of the preliminary trench structure is shallower than a height of the upper insulating layer.

4. The method of claim 1,
   wherein a bottom surface of the preliminary trench structure exposes the upper insulating layer.

5. The method of claim 1,
   wherein the preliminary trench structure is spaced apart from a sacrificial layer most adjacent to the upper insulating layer among the sacrificial layers.

6. The method of claim 1,
   wherein forming the trench comprising etching at least one of the conductive patterns through the preliminary trench structure, and
   wherein a depth of the trench is deeper than a depth of the preliminary trench structure.

7. The method of claim 6, further comprising forming a select line isolation structure inside the trench.

8. The method of claim 1, further comprising forming channel structures penetrating the stack structure.

9. The method of claim 8, wherein the channel structures include:
   a first channel structure and a second channel structure, spaced apart from each other at a first distance; and
   a third channel structure and a fourth channel structure, spaced apart from each other at a second distance.

10. The method of claim 9,
    wherein the slit penetrates the stack structure between the first channel structure and the second channel structure, and
    wherein the preliminary isolation structure is disposed between the third channel structure and the fourth channel structure.

11. The method of claim 9,
    wherein the second distance is narrower than the first distance.

12. The method of claim 1,
    wherein the forming of the slit is performed after the forming of the preliminary isolation structure.

* * * * *